(12) United States Patent
Bapst et al.

(10) Patent No.: US 7,212,698 B2
(45) Date of Patent: May 1, 2007

(54) CIRCUIT BOARD INTEGRATED OPTICAL COUPLING ELEMENTS

(75) Inventors: Urs Bapst, Neuhaus (CH); Christoph Berger, Horgen (CH); Russell Alan Budd, North Salem, NY (US); Folkert Horst, Zurich (CH); Bert Jan Offrein, Langnau am Albis (CH)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/775,854

(22) Filed: Feb. 10, 2004

(65) Prior Publication Data

US 2005/0176161 A1  Aug. 11, 2005

(51) Int. Cl.
  *G02B 6/12* (2006.01)
  *G02B 6/26* (2006.01)
  *G02B 6/42* (2006.01)
  *G02B 6/10* (2006.01)
  *H01L 21/00* (2006.01)

(52) U.S. Cl. .......................... 385/14; 385/52; 385/129; 385/130; 385/131; 385/132; 438/31

(58) Field of Classification Search ................ 385/14, 385/52, 129–132; 438/31
  See application file for complete search history.

(56) References Cited

U.S. PATENT DOCUMENTS 5,101,090 A * 3/1992 Coyle et al. ............ 219/121.68
5,122,852 A * 6/1992 Chang et al. ................ 257/184
6,236,788 B1    5/2001 Moisel ........................ 385/52
6,832,013 B1 * 12/2004 Kuhmann et al. ............ 385/14
6,982,437 B2 * 1/2006 Gallup et al. ................ 257/100
2001/0046346 A1 * 11/2001 Burns ........................... 385/18
2002/0075107 A1 * 6/2002 Burdick et al. .............. 333/260
2003/0021541 A1    1/2003 Carpenter .................... 385/52

OTHER PUBLICATIONS

Miller, D.A.B., "Rationale and Challenges for Optical Interconnects to Electronic Chips," Proceedings of the IEEE, vol. 88, No. 6, pp. 728-749 (Jun. 2000).
Nordin et al., "A Systems Perspective on Digital Interconnnection Technology," Journal of Lightwave Technology, vol. 10, No. 6, pp. 811-827 (Jun. 1992).

* cited by examiner

*Primary Examiner*—Brian Healy
*Assistant Examiner*—Jerry Martin Blevins
(74) *Attorney, Agent, or Firm*—Ryan, Mason & Lewis, LLP; Daniel P. Morris, Esq.

(57) ABSTRACT

Techniques for circuit board processing are provided. In one aspect, a method of processing a circuit board having one or more optical waveguides associated therewith is provided. The method comprises the following steps. One or more etch stop layers in proximity to the one or more waveguides are provided, at least one of the etch stop layers comprising one or more fiducials therein. From a surface of the circuit board, the one or more etch stop layers are used to selectively remove material to provide openings having a defined positioning and depth in the circuit board. A circuit board having one or more optical waveguides associated therewith is also provided.

23 Claims, 14 Drawing Sheets

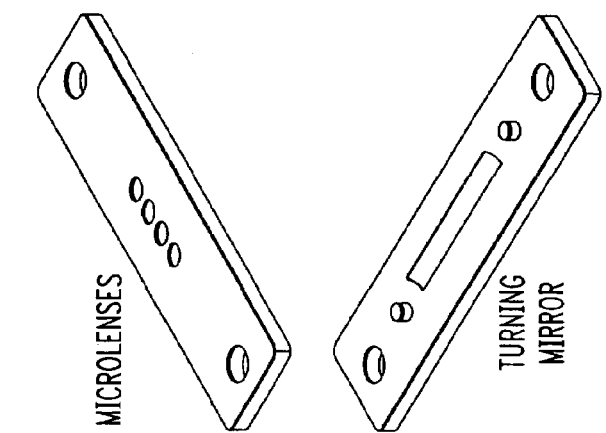
FIG. 17
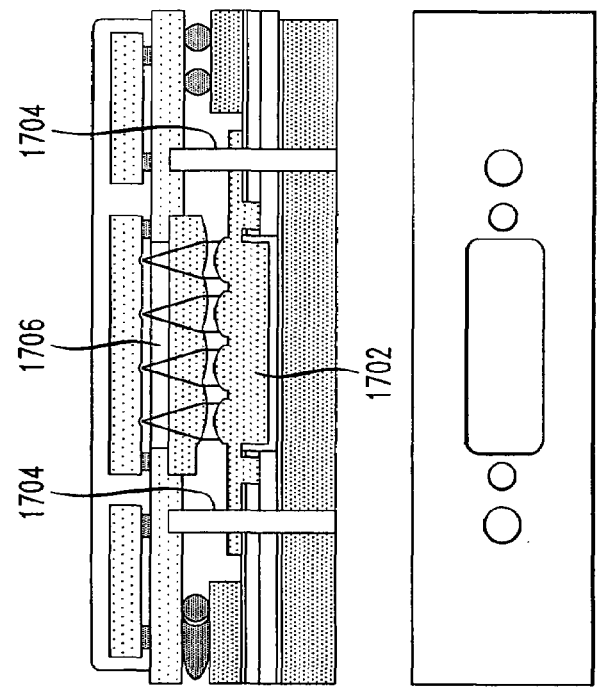
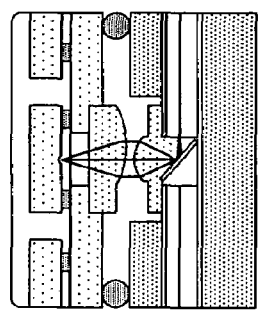

CIRCUIT BOARD INTEGRATED OPTICAL COUPLING ELEMENTS

FIELD OF THE INVENTION

The present invention relates to circuit boards and, more particularly, to circuit boards having integrated optical waveguides.

BACKGROUND OF THE INVENTION

Printed circuit boards (PCBs) typically comprise many layers, including metal wiring layers and organic and/or ceramic insulating layers. PCBs may also contain "optical wiring layers" comprising single-mode, multi-mode or other dimension optical waveguides. A large number of waveguides may be placed in a given area, e.g., greater than 100 waveguides per centimeter. This is important because with equipment such as servers, supercomputers and telecom switch-routers, which consist of multiple racks, each rack having an aggregate data rate reaching multiple terabits per second (Tb/s), i.e., potentially on the order of tens of Tb/s, a larger capacity is needed.

Further, the waveguides are easily patterned, routed and are insensitive to electrical interferences within the PCB. The use of such waveguides provides several notable benefits, including the ability to transmit data in the optical domain.

The waveguides may be integrated in the PCB. By integrating the waveguides within the PCB, several advantages may be achieved. For example, the individual waveguides are protected from the environment, can be routed directly underneath opto-electronic (OE) modules and allow valuable top PCB surface space to be preserved for other components.

A waveguide typically comprises a cladding layer and a core formed in the cladding layer. Such a waveguide may be fabricated by first forming a cladding layer on a substrate. On top of the cladding layer, the core layer is next deposited and patterned to achieve lateral definition. The core layer is covered with another cladding layer, to bury the core layer.

The refractive index of the core is selected to be larger than either of the cladding layers. The materials making up the cladding layers and the core layer are optically transparent, to obtain low propagation loss. Multi-mode waveguides typically have a cross-sectional geometry of about 50 square micrometers ($\mu m$).

OE modules may contain optical transceivers, for example, vertical cavity surface emitting lasers (VCSELs) and photodiodes (PDs) which serve to transmit and receive optical signals, respectively. These OE modules can reside on/in the PCB, adjacent to/integrated with processors, application specific integrated circuits (ASICs) and memory controllers, whenever dense, high speed optical interconnects are required.

Precise alignment of an optical component (e.g., with an accuracy of about five $\mu m$), which can be the OE module itself or another optical component, such as a lens or a mirror, is needed to couple the light, e.g., from the VCSELs into the waveguides and/or from the waveguides to the PDs. Various typical coupling concepts exist. These coupling concepts, however, require first positioning the optical components in a rough proximity to the waveguides (e.g., with an accuracy of greater than or equal to about 50 $\mu m$) and then further actively aligning the optical components with the waveguide core, to attain the precise alignment accuracy needed. These "active alignment" steps are however inaccurate, as well as, time consuming and cumbersome for the operator.

Therefore, techniques are needed for aligning optical components with waveguides without active alignment steps.

SUMMARY OF THE INVENTION

The present invention provides techniques for processing circuit boards having integrated optical components. The processing techniques involve steps useful to align optical components with waveguides without active alignment steps. In one aspect of the invention, a method of processing a circuit board having one or more optical waveguides associated therewith comprises the following steps. One or more etch stop layers in proximity to the one or more waveguides are provided, at least one of the etch stop layers comprising one or more fiducials therein. From a surface of the circuit board, the one or more etch stop layers are used to selectively remove material to provide openings having a defined positioning and depth in the circuit board.

In another aspect of the invention, a circuit board having one or more optical waveguides associated therewith is provided. The circuit board comprises one or more openings each created with a positioning and depth defined using one or more etch stop layers located in proximity to the one or more waveguides, at least one of the etch stop layers comprising one or more fiducials therein.

Thus, advantageously, the openings having a defined positioning and depth in the circuit board, fabricated using the above methodology, may be employed to optimize the alignment of optical components with waveguides. Therefore, active alignment steps are unnecessary.

A more complete understanding of the present invention, as well as further features and advantages of the present invention, will be obtained by reference to the following detailed description and drawings.

BRIEF DESCRIPTION OF THE DRAWINGS

FIG. 17 is a diagram illustrating an exemplary method used to achieve precise lateral alignment between an optical element, a waveguide core and an opto-electronic (OE) module according to an embodiment of the present invention;

DETAILED DESCRIPTION OF PREFERRED EMBODIMENTS

Figure 1:
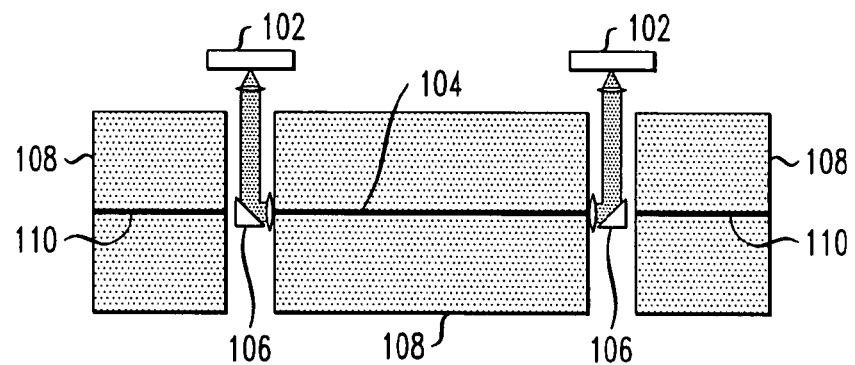
FIG. 1 is a diagram illustrating a typical coupling concept.
Figure 2:
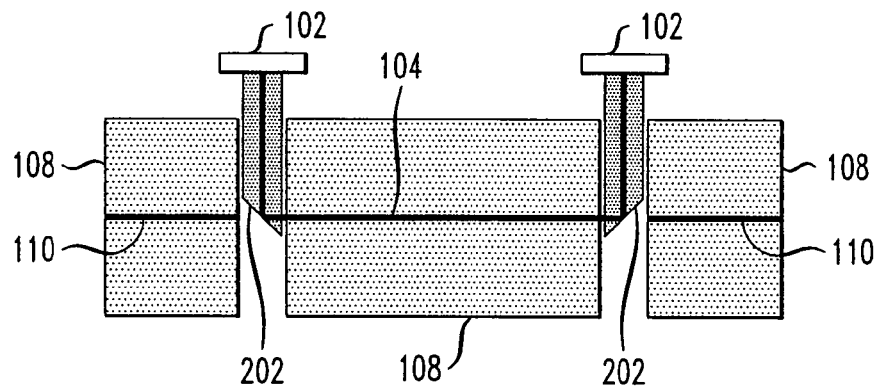
FIG. 2 is a diagram illustrating another typical coupling concept.
Figure 3:
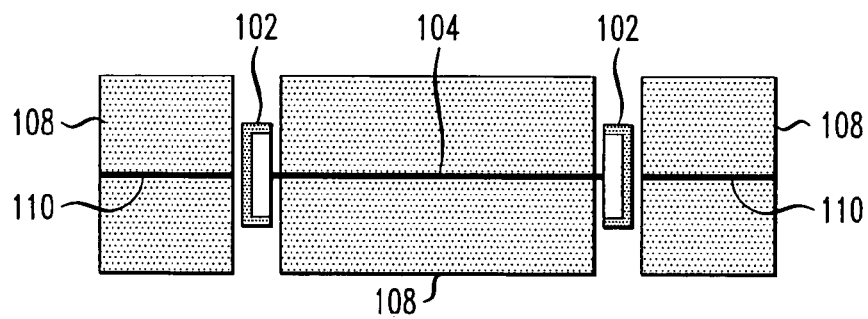
FIG. 3 is a diagram illustrating yet another typical coupling concept.

Before explaining illustrative embodiments of the present invention, some existing optical coupling concepts are disclosed. FIGS. 1–3 depict several such concepts.

In FIG. 1, OE module 102 is located on top of printed circuit board (PCB) 108, and light is directed into waveguide 110 along light path 104 using turning mirrors 106. In FIG. 2, OE module 102 is also located on top of PCB 108, but light is directed into waveguide 110 along light path 104 using turning mirror 202 which is integrated in waveguide 110. In FIG. 3, OE module 102 is located in PCB 108, and light is directed directly into waveguide 110 along light path 104. Additionally, other coupling approaches, including combinations of several of the concepts shown in FIGS. 1–3, may be developed.

In each of FIGS. 1–3, access to the waveguides is provided through openings, or cavities, in the PCB. According to these conventional techniques, such openings are produced using mechanical drilling techniques. Specifically, holes for pins used to orient layers during the fabrication of the PCB are further used to orient a mechanical router device. The router device, using the holes to position itself on the PCB, can mechanically drill openings in the PCB with an accuracy of greater than or equal to about 50 μm, typically greater than or equal to about 100 μm. While such tolerances are suitable for some applications, for example, for the production of vias, these tolerances are not strict enough for aligning optical components (e.g., with an accuracy of about five μm). Therefore, each of the coupling concepts described in conjunction with the description of FIGS. 1–3 require further active alignment steps to couple the OE module with the waveguide.

Techniques wherein such active alignment steps are eliminated, e.g., through processing steps that introduce precise positioning and alignment features in the circuit board, as will be described in detail below, are therefore desirable. Illustrative embodiments of the present invention will now be explained.

For ease of reference, the following description will be divided into the following sections; (I) Aligning or Fabricating Waveguide Cores Relative to Fiducials, (II) Integrating Waveguide Layers Into a PCB, (III) Accessing Waveguide Layers Within a PCB Using Selective Stops, (IV) Attaining Alignment Between Optical Components and Waveguide Cores, (V) Attaining Alignment Between Optical Components and an EO Module or Other Assembly, (VI) Extending Optical Components to Multi-layer Waveguide Configurations and (VII) Staggering Microlens/Focusing to Increase the Waveguide Density.

(I) Aligning or Fabricating Waveguide Cores Relative to Fiducials

Figure 4A:
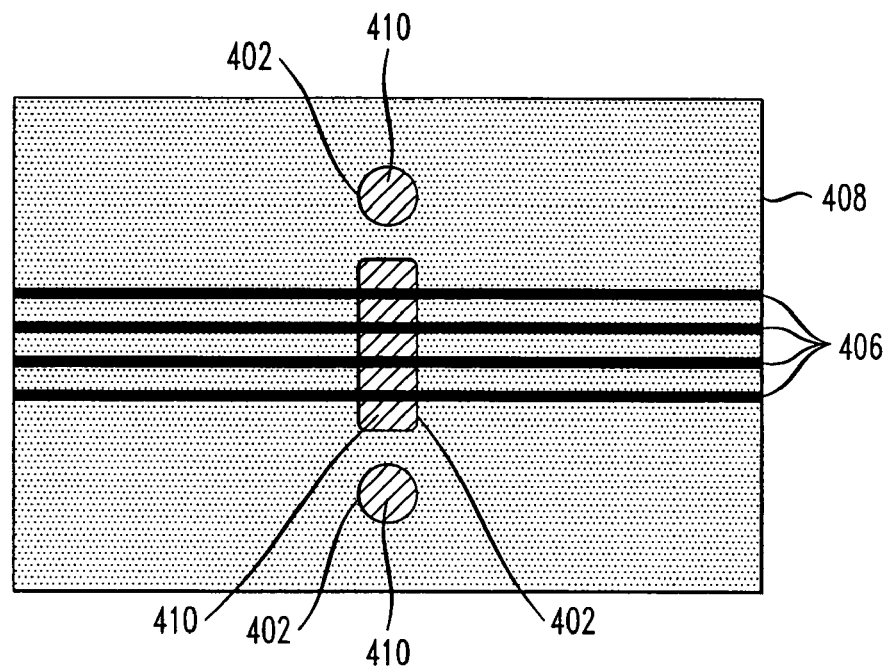
FIGS. 4A–C are diagrams illustrating the fabrication of waveguide cores relative to fiducials using a glass substrate according to an embodiment of the present invention.
Figure 4B:
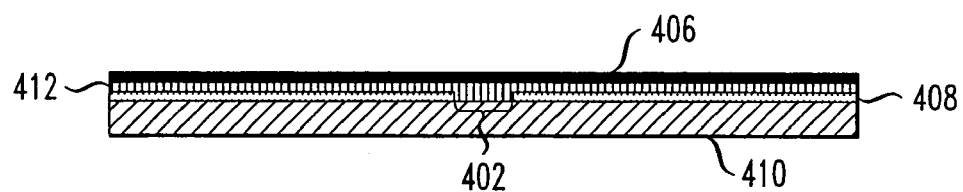
Figure 4C:
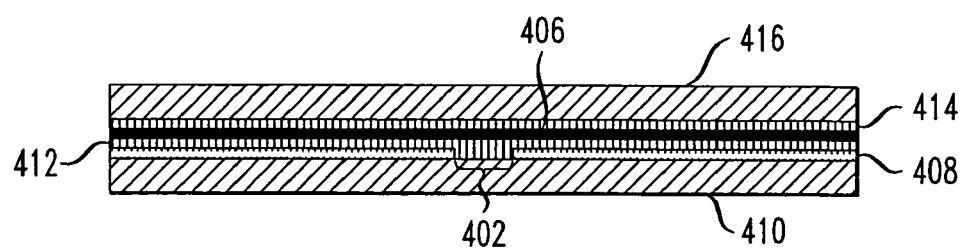

FIGS. 4A–C are diagrams illustrating the fabrication of waveguide cores relative to fiducials using a glass substrate. Namely, FIG. 4A shows a top view of waveguide cores 406 in proximity to (on top of) an etch stop layer, e.g., metal layer 408, metal layer 408 having fiducials 402 which will serve to align optical components with waveguide cores 406. In an exemplary embodiment, waveguide cores 406 are deposited as a single core layer, and then patterned using lithography to form individual cores. However, care must be taken to precisely align the resulting waveguide cores 406 relative to fiducials 402 in metal layer 408. The structure is supported on lower glass substrate 410.

As is illustrated in FIG. 4A, metal layer 408 is located beneath waveguide cores 406. As will be described in detail below, metal layers, such as metal layer 408, located in proximity to the waveguides, will be used to define a positioning and depth of openings made in the PCB, the openings to be used to align optical components with the waveguides.

The term "fiducial," as used herein, denotes a reference mark or opening in one or more of the etch stop layers, such as an opening that will be used to define an opening in the PCB, usually of a predetermined shape and size. For example, fiducials present in the metal layer located in proximity to the waveguides may serve to define openings in the PCB for use in aligning optical components with the waveguides.

The formation of fiducials in a metal layer will be described in detail below. Optical components will also be described below, for example, in conjunction with the description of FIGS. 11–14.

FIG. 4B shows a cross-sectional view of the configuration shown in FIG. 4A. The cross-sectional view indicates that bottom cladding layer 412 is present between waveguide cores 406 and metal layer 408. The cross-sectional view in FIG. 4C shows completion of the waveguide stack by the application of top cladding layer 414 on top of waveguide cores 406, and upper glass substrate 416 on top of top cladding layer 414. As such, a PCB with integrated waveguides and associated reference points for optical components is created.

It is desirable to protect the waveguides by laminating upper glass substrate 416 on top of top cladding layer 414, which may be accomplished by normal lamination means. In addition to protecting the waveguide layers, i.e., waveguide cores 406, bottom cladding layer 412 and top cladding layer 414, upper glass substrate 416 also provides an area for additional electrical wiring and components above the waveguides.

Figure 5A:
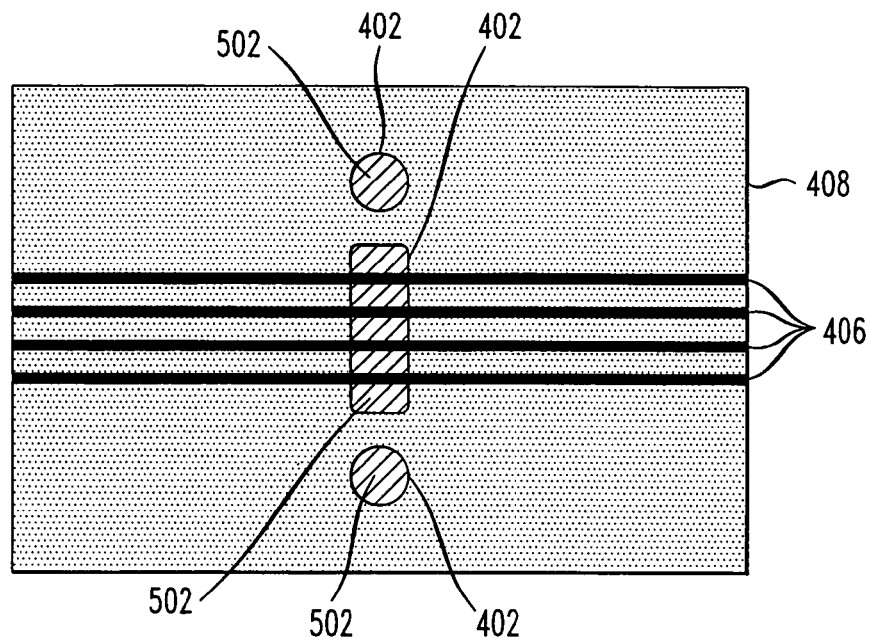
FIGS. 5A–C are diagrams illustrating the fabrication of waveguide cores relative to fiducials using an organic substrate according to an embodiment of the present invention.
Figure 5B:
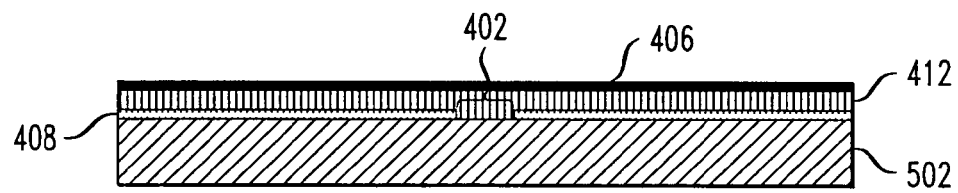
Figure 5C:
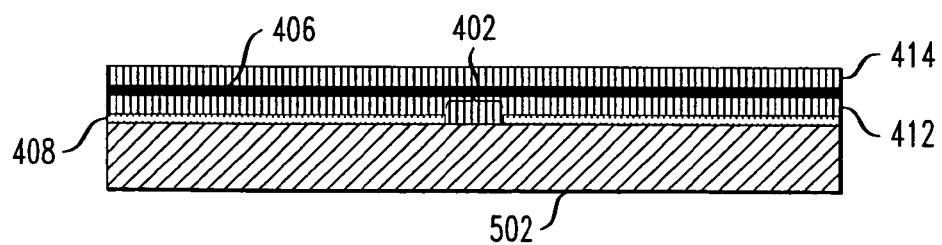

FIGS. 5A–C are diagrams illustrating the fabrication of waveguide cores relative to fiducials using an organic substrate. As was described above in conjunction with the description of FIGS. 4A–C, a PCB with integrated waveguides and associated reference points for optical components can be created. FIG. 5A provides a top view and FIGS. 5B–C provide cross-sectional views of the fabrication of such a structure using an organic substrate material, i.e., organic substrate 502. Organic substrate 502 may comprise any suitable organic substrate material, including, but not limited to, FR4 printed circuit board material. In contrast to the structure shown in FIG. 4C, there is no substrate present above top cladding 414. Thus, while the present description will focus on waveguides integrated into the PCB, e.g., having one or more layers above the waveguide layers, the teachings herein should be construed to include any configuration wherein the waveguides are associated with a PCB, including, but not limited to, configurations wherein the waveguides comprise a top layer of the PCB.

Figure 6A:
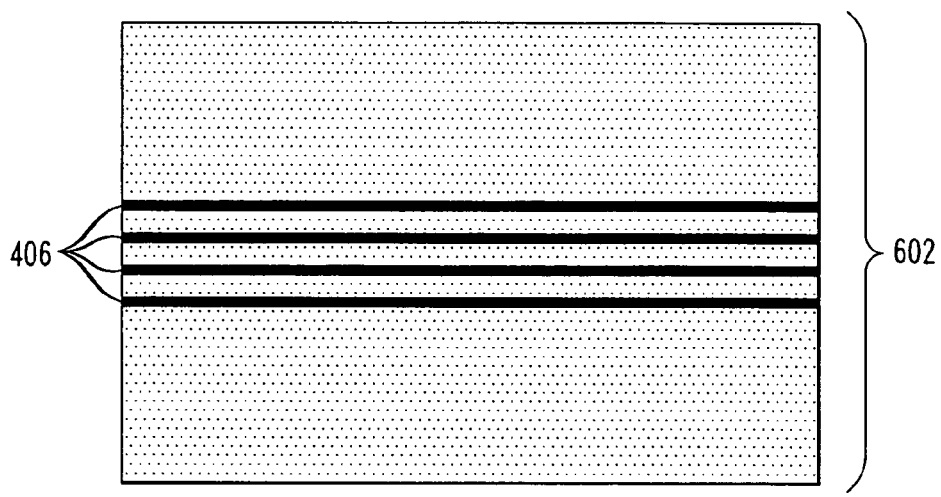
FIGS. 6A–C are diagrams illustrating the fabrication of waveguide cores relative to fiducials using a polyimide substrate according to an embodiment of the present invention.
Figure 6B:
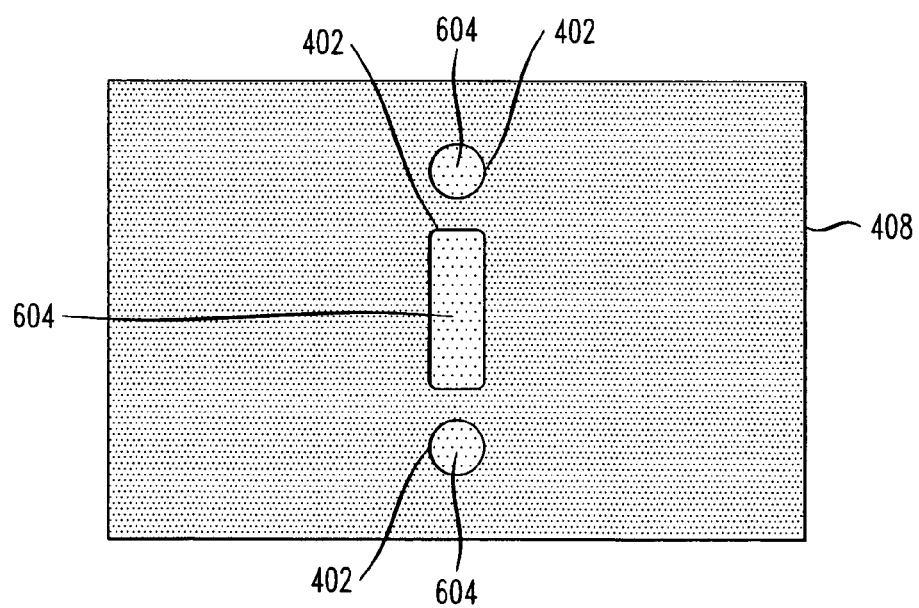
Figure 6C:
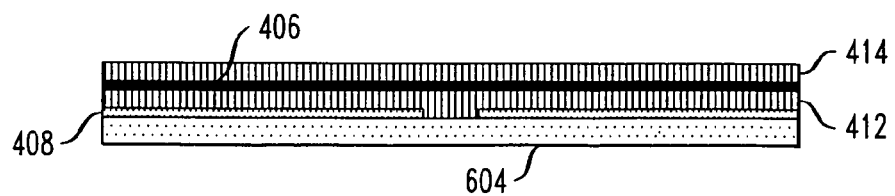

FIGS. 6A–C are diagrams illustrating the fabrication of waveguide cores relative to fiducials using a polyimide substrate. As was described above in conjunction with the description of FIGS. 4A–C and FIGS. 5A–C, a PCB with integrated waveguides and associated reference points for optical components can be created. In this particular case, flexible organic substrate material 604, such as polyimide, is employed.

A flexible organic substrate has the advantage that it allows waveguide layers, i.e., waveguide film 602, to be laminated together using "roll to roll" manufacturing, in a process similar to newspaper printing, wherein one or more flexible materials are applied from a roll. This manufacturing process allows for the waveguide layers to be deposited accurately which is important because, as described above, when the waveguide layers are brought together with the metal layer, care must be taken to accurately align the waveguide cores with the fiducials in the metal layer. Regarding the exemplary embodiments shown in FIGS. 4A–C, FIGS. 5A–C and FIGS. 6A–C, wherein the waveguide cores are defined along the metal layer, it is important to note that a high level of alignment accuracy is already achieved.

The creation of fiducials in the metal layer, which serve as reference points, or markers, throughout the fabrication process, may be achieved using lithography techniques. The lithography of the metal layer may be done through either a foil-based mask or a glass mask. Foil-based masks are standard in lithography for patterning metal layers. Glass masks are commercially available in large sizes up to 60 centimeters.

As described above, the waveguide cores may be deposited as a single core layer and processed using lithography to pattern individual waveguide cores. This step produces waveguides that are aligned with a high level of accuracy with respect to the fiducials in the metal layer. However, several factors must be considered. When the metal layer is realized through a foil mask, factors such as expansion and skew need to be taken into account. Expansion and skew can be corrected for using a gantry based ultraviolet (UV) writing system that measures the positioning of each fiducial and corrects the waveguide writing, e.g., the exposure of the waveguides that defines the solvable and unsolvable regions for the development process, accordingly.

When the metal layer is realized through a glass mask, factors such as expansion and skew are less prominent and as such waveguide definition can be achieved with the UV writing system as above, or simply by having the glass mask accurately aligned with respect to the desired placement of the fiducials in the metal layer.

Special care is also taken to obtain accurate thickness controls of the waveguide layers, to an accuracy of about three micrometers (µm). Commercially available measurement heads that enable in-situ controlling of the thickness of the waveguide layers during deposition may be employed. In an exemplary embodiment, the waveguide has a thickness of about 200 µm, e.g., bottom cladding layer having a thickness of about 50 µm, waveguide core having a thickness of about 50 µm and top cladding having a thickness of about 100 µm.

(II) Integrating Waveguide Layers Into a PCB

The techniques for fabricating the waveguide layers presented above assure that the waveguide layers are accurately positioned relative to the fiducials in the metal layer to within lithographic accuracies.

Figure 7A:
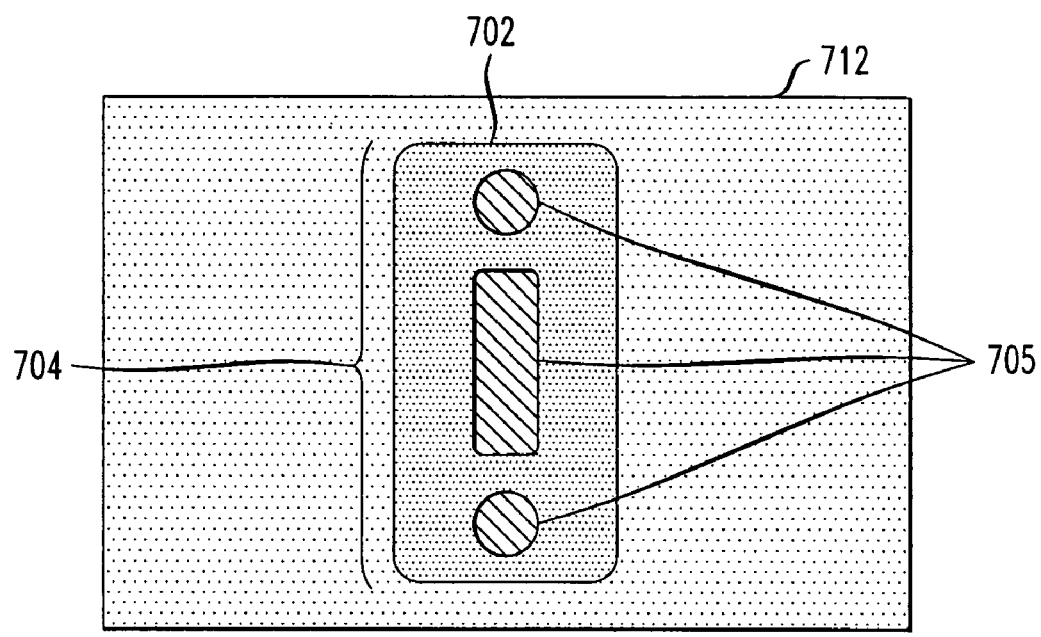
FIGS. 7A–B are diagrams illustrating the integration of waveguide layers into a printed circuit board (PCB) using two metal layers having fiducials therein according to an embodiment of the present invention.
Figure 7B:
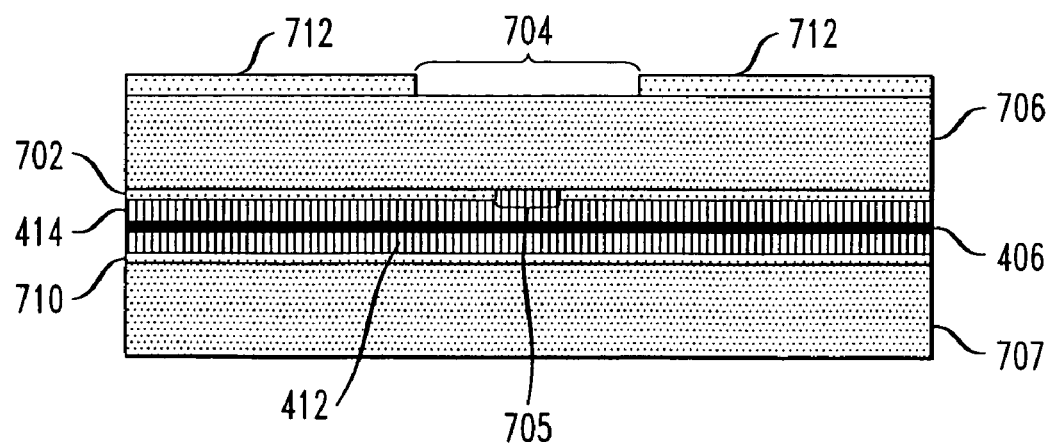

FIGS. 7A–B are diagrams illustrating the integration of waveguide layers into a PCB using two metal layers having fiducials therein. Namely, FIG. 7A shows a top view of top metal layer 712 and lower metal layer 702, each having fiducials, i.e., top metal layer fiducial 704 and lower metal layer fiducials 705, respectively. Each of top metal layer 712 and lower metal layer 702 may comprise any suitable metals, including, but not limited to, copper, molybdenum, gold and combinations comprising at least one of the foregoing metals. In an exemplary embodiment, both top metal layer 712 and lower metal layer 702 comprise copper. Each metal layer in the PCB may serve as an etch stop layer, e.g., when the PCB is subject to selective laser ablation processing, as will be described in detail below. For example, top metal layer 712 and lower metal layer 702 may each serve as selective etch stops, preventing etching, except within the confines of the respective fiducials. Additional metal layer 710, as will be described in conjunction with the description of FIG. 7B below, acts as a complete etch stop layer, as it contains no fiducials.

FIG. 7B is a cross-sectional view of one possible configuration of a PCB, with top metal layer 712, having top metal layer fiducial 704 therein, on top of upper organic substrate 706 and in proximity to, e.g., above, the waveguide layers. Below upper organic substrate 706 is lower metal layer 702, having lower metal layer fiducials 705 therein. The waveguide layers, namely top cladding 414, waveguide cores 406 and bottom cladding 412, are located directly beneath lower metal layer 702. Below the waveguide layers is additional metal layer 710. Additional metal layer 710 does not have any fiducials therein and thus serves as a complete etch stop layer. Below additional metal layer 710 is lower organic substrate 707.

Figure 8A:
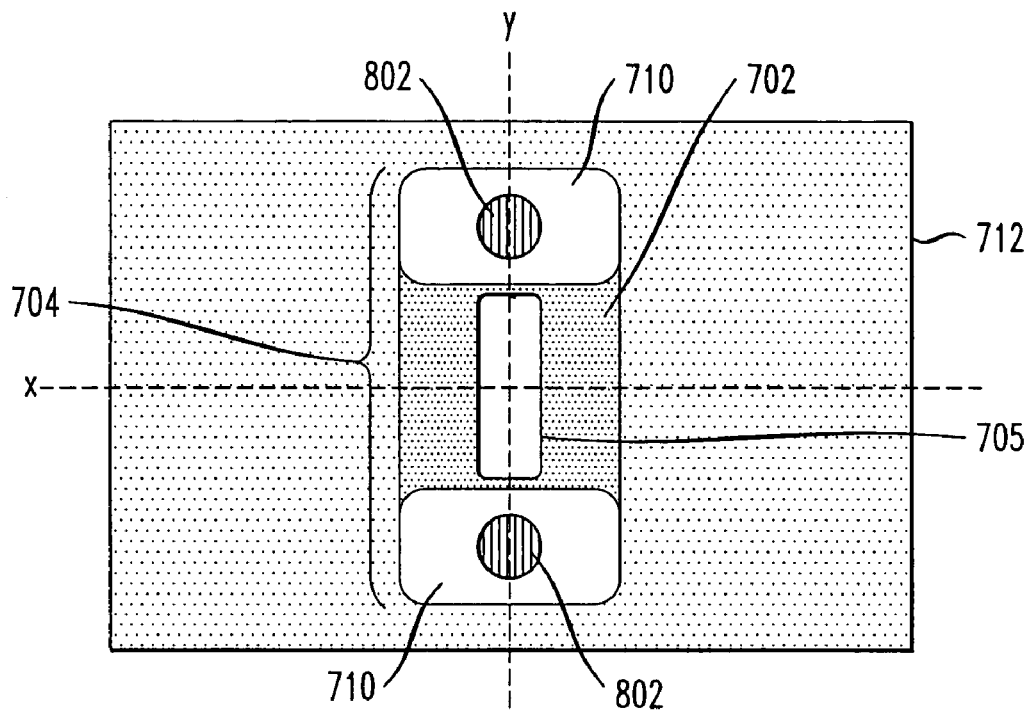
FIGS. 8A–B are diagrams illustrating the integration of waveguide layers into a PCB using three metal layers having fiducials therein according to an embodiment of the present invention.
Figure 8B:
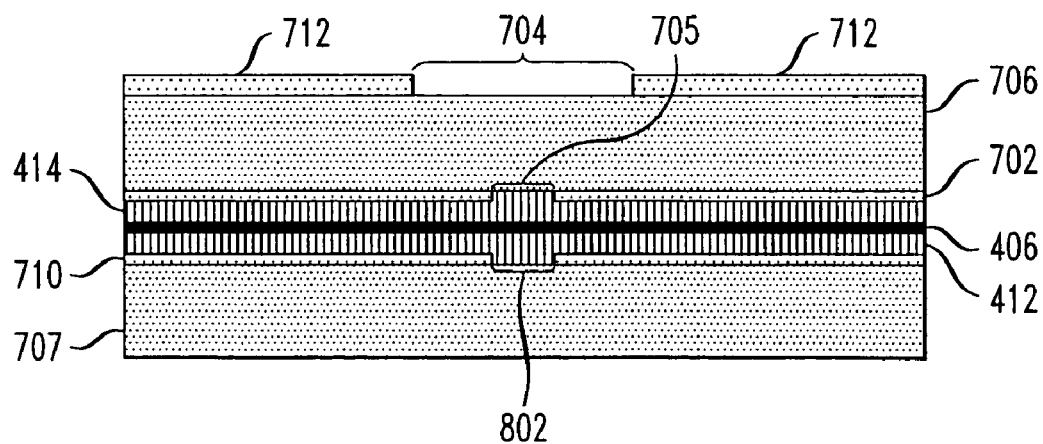

FIGS. 8A–B are diagrams illustrating the integration of waveguide layers into a PCB using three metal layers having fiducials therein. Namely, FIG. 8A provides a top view and FIG. 8B provides a cross-sectional view of a PCB having a configuration similar to the configuration illustrated in FIGS. 7A–B except for additional metal layer fiducials 802 being present in additional metal layer 710. As such, in the embodiment shown in FIGS. 8A–B, additional metal layer 710 serves as a selective etch stop.

Further shown in FIG. 8A are the x and y axes of the PCB. These axes will be used throughout the description in regard to the positioning of openings for optical components along the respective planes of the PCB. A third axis, the z axis, as shown for example in FIG. 15, will be used in regard to the depth that, e.g., openings for optical components, extend into the PCB. Openings for optical components will be described in detail in section III below.

In an exemplary embodiment, additional metal layer fiducial 802 defines the space that will be used for x axis and y axis alignment of the optical components that will be associated with the PCB, lower metal layer fiducials 705 will be used to define an opening in which a turning mirror will be inserted and top metal layer fiducial 704 will be used to define an opening in which one or more OE modules will be inserted.

(III) Accessing Waveguide Layers Within a PCB Using Selective Stops

The fiducials, or markers, in the metal layers enable the realization of alignment holes through selective laser ablation, or drilling. Substrate materials, such as organic materials and glass, absorb a significant portion of photon energy in the nine to ten micron wavelength range, and may be ablated using a carbon dioxide ($CO_2$) laser. Copper, molybdenum, gold, or other metals, if thick enough, reflect this radiation and efficiently conduct heat. The metal layers can thus serve as effective laser ablation stops. Therefore, laser ablation from the surface of the PCB, through the fiducials in the metal layer(s), may be employed to remove material to provide openings in the PCB.

As an alternative to laser ablation, a reactive ion etch process, through fiducials in the metal layer(s), may be employed to remove at least a portion of the, e.g., organic substrate material. According to this exemplary technique, substrate material above the metal layer may be at least partially removed using, e.g., a mechanical routing process, leaving at least a thin layer of material above the metal layer. This thin layer of material may then be effectively removed using reactive ion etching.

Further, as an alternative to using one or more metal layers, a multi-layer thin film dielectric stack may be employed. The thin film stack can be designed to efficiently reflect light from the laser, e.g., having reflectances of greater than about 99 percent.

The use of metal layers as selective laser ablation stops can result in a precise, predetermined alignment of optical components along the x axis and y axis of the PCB. Accurate depth alignment, i.e., along the z axis, is obtained through an etch stop layer being present at the appropriate predetermined etch depth. The vertical distance between the etch stop layer and the waveguide layers can be controlled either through use of a glass substrate having a well defined thickness, e.g., acting as the cladding layer(s) or through accurate thickness control of the optical layers during deposition. Through selective laser drilling, the openings can be accurately defined with respect to the waveguide layers and serve as receptacles for optical components, such as lens, turning mirrors and OE modules.

Figure 9A:
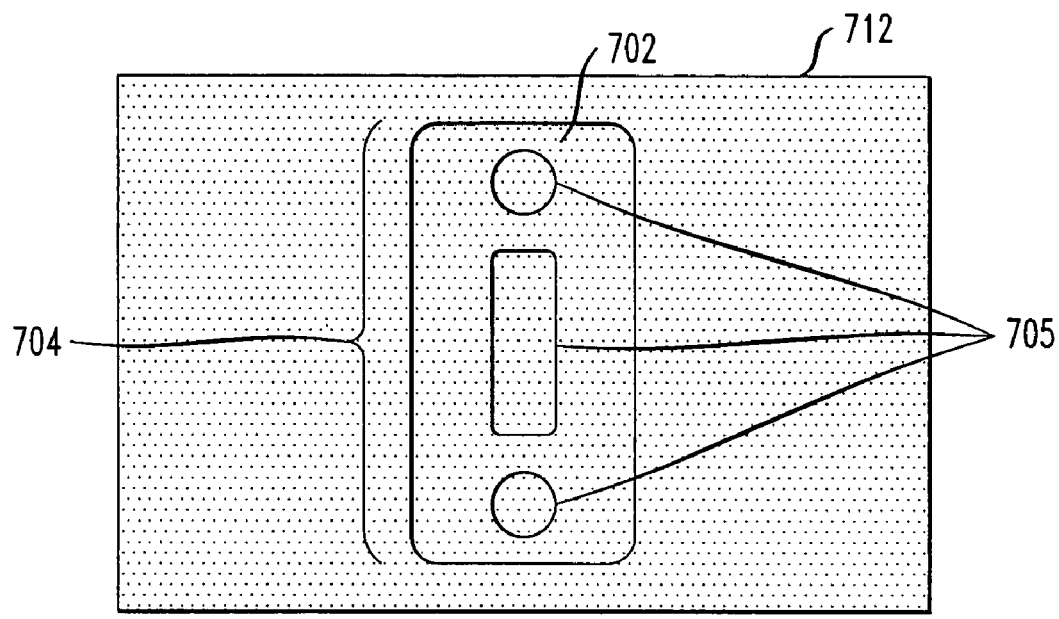
FIGS. 9A–B are diagrams illustrating the accessing of a waveguide layer within a PCB using selective etch stops with fiducials on top of the waveguide according to an embodiment of the present invention.
Figure 9B:
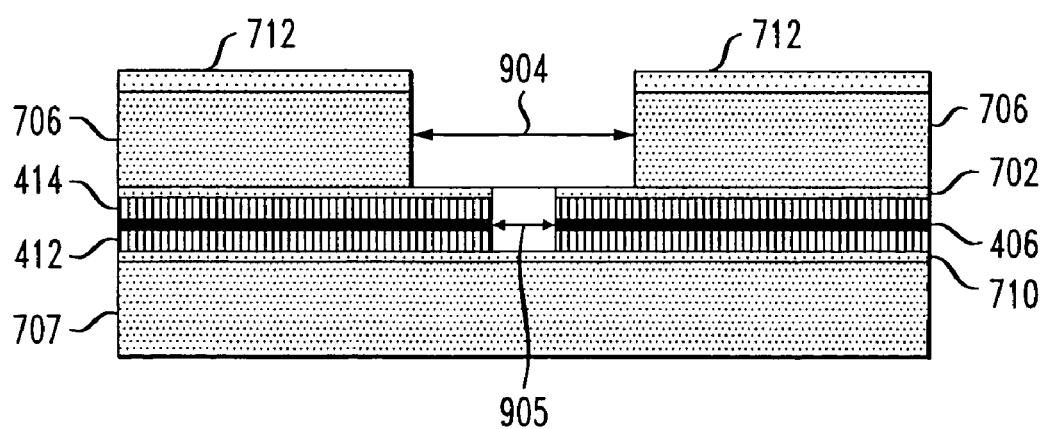

FIGS. 9A–B are diagrams illustrating the accessing of a waveguide layer within a PCB using selective etch stops with fiducials on top of the waveguide. Namely, FIG. 9A shows a top view of an exemplary PCB subject to selective laser drilling. As shown in FIG. 9A, top metal layer 712, having top metal layer fiducial 704, defines opening for optical components 904, which will be described in conjunction with the description of FIG. 9B, below. Lower metal layer 702, having lower metal layer fiducials 705, defines opening for turning mirror 905, which will also be described in conjunction with the description of FIG. 9B, below.

According to the present techniques described herein, accessing the waveguide comprises any technique that permits coupling of light with the waveguide core. Thus, for example, the waveguide may be accessed by exposing a portion of the waveguide, e.g., exposing a portion of the core. However, exposing a portion of the waveguide may not be necessary to couple light with the core.

FIG. 9B shows a cross-sectional view of a PCB subject to selective laser drilling. The configuration of the PCB is the same as that shown and described in conjunction with the description of FIGS. 7A–B. As shown in FIG. 9B, selective laser drilling, i.e., as through top metal layer fiducial 704 and lower metal fiducials 705, results in opening for optical components 904 and opening for turning mirror 905, respectively. As is shown in FIG. 9B, lower metal layer 702 acts as an etch stop and thus provides depth alignment for opening for optical components 904. Likewise, additional metal layer 710 acts as an etch stop and thus provides depth alignment for opening for turning mirror 905. Thus, in this exemplary embodiment, precise alignment along the x axis and y axis of the PCB is achieved with one metal layer, i.e., lower metal layer 702, and alignment along the z axis of the PCB is achieved with a second metal layer, i.e., additional metal layer 710.

Figure 10A:
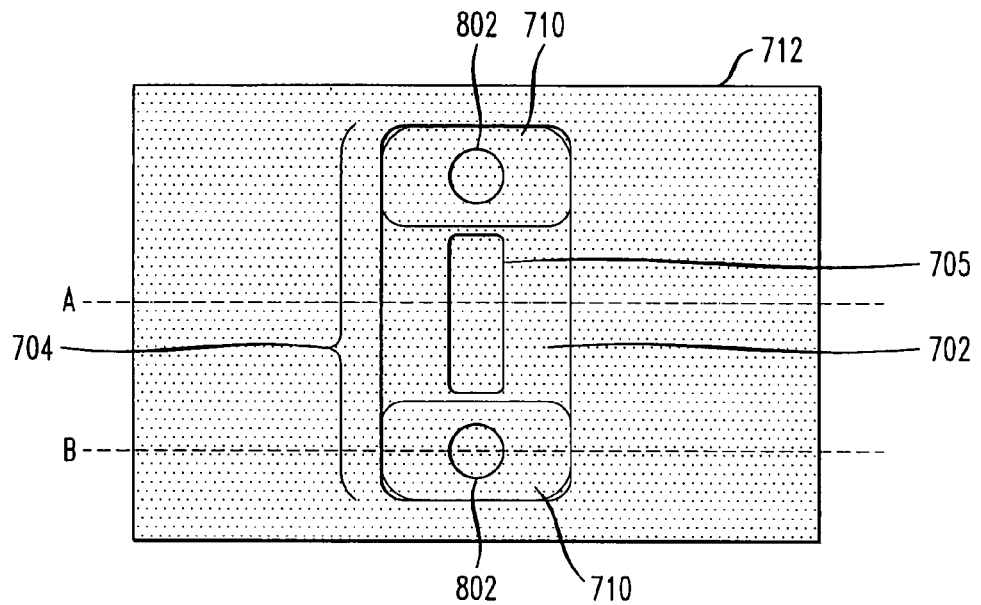
FIGS. 10A–C are diagrams illustrating the accessing of a waveguide layer within a PCB using selective etch stops with fiducials on the bottom of the waveguide according to an embodiment of the present invention.
Figure 10B:
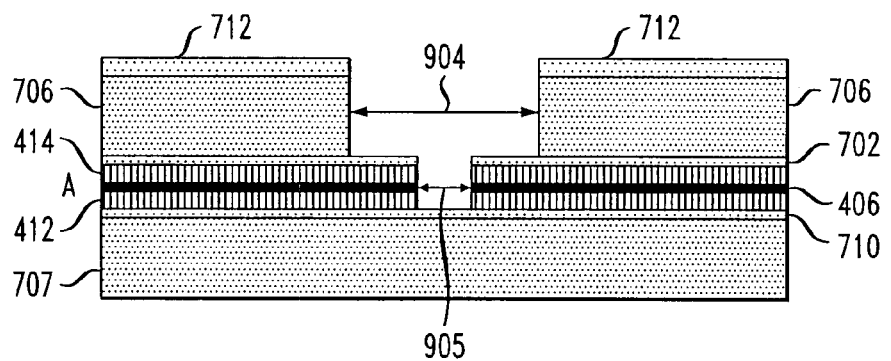
Figure 10C:
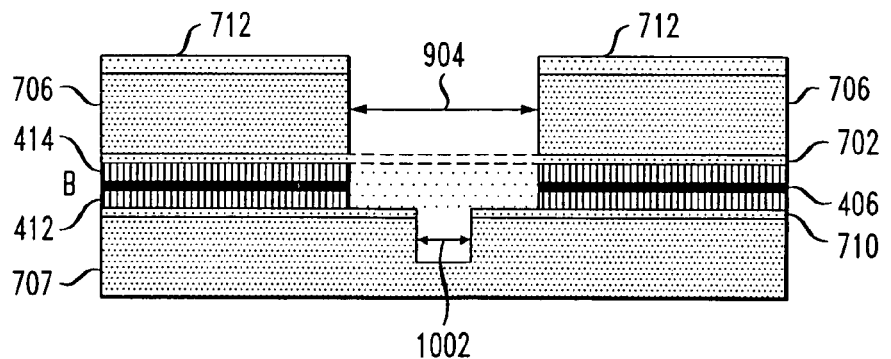

FIGS. 10A–C are diagrams illustrating the accessing of a waveguide layer within a printed circuit board using selective etch stops with fiducials on the bottom of the waveguide. The exemplary embodiment shown in FIGS. 10A–C is the same as that shown and described in conjunction with the description of FIGS. 9A–B, except that additional metal layer 710 has additional metal layer fiducials 802 therein. FIG. 10B, a cross-sectional view along plane A of the PCB shown in FIG. 10A, shows that top metal layer fiducial 704 and lower metal fiducials 705 result in opening for optical components 904 and opening for turning mirror 905, respectively. FIG. 10C, a cross-sectional view along plane B of the PCB shown in FIG. 10A, shows that additional metal layer fiducial 802 results in opening 1002, e.g., an opening for an alignment pin. Alignment pins, as will be described below, for example, in conjunction with the description of FIG. 11, serve to physically align and orient optical components with the waveguide layers. The opening(s) for alignment pins thus serve as reference points to align the optical components.

In the exemplary embodiment shown in FIGS. 10A–C, additional metal layer fiducial 802 defines an opening for x axis and y axis alignment as well as an etch stop for an OE module. Thus, in this exemplary embodiment, precise alignment along the x, y and z axes is achieved with the same metal layer, i.e., additional metal layer 710.

(IV) Attaining Alignment Between Optical Components and Waveguide Cores

As mentioned above, the optical components may have one or more alignment pins associated therewith that serve to physically align and orient the optical components with the waveguide layers. Thus, the alignment pins should fit precisely in one or more of the openings in the PCB, i.e., opening 1002. Accurate x, y and z axes alignment is achieved through the combination of the precise shape/position of the pins and through the exact position and depth of the corresponding opening(s) in the PCB, as achieved through the selective laser ablation process.

Figure 11:
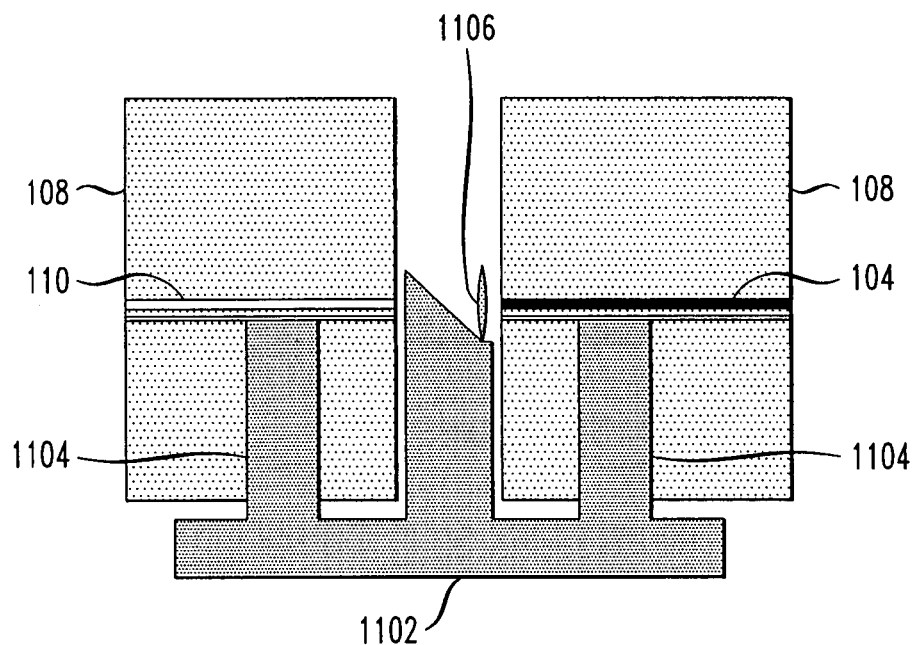
FIG. 11 is a diagram illustrating a monolithic optical component according to an embodiment of the present invention.

There are several techniques that may be employed to use the alignment pins to align and orient the optical components with the waveguide layers, i.e., in a passive manner. In a first exemplary embodiment, the optical components are directly positioned in one or more of the openings in the PCB. FIG. 11 depicts such a configuration. FIG. 11 is a diagram illustrating a monolithic optical component. In FIG. 11, monolithic element 1102, having alignment pins 1104, is mounted in PCB 108. Monolithic element 1102 comprises optical element 1106, e.g., a lens, which is shown aligned with waveguide 110 to direct light along light path 104.

Monolithic element 1102 can be manufactured through micro-machining or molding processes. It is essential to have a precise realization of this structure with tolerances clearly smaller than the alignment tolerance of the optical element with respect to the waveguide (i.e., less than or equal to about five microns). According to this exemplary embodiment, precise alignment of the optical components, e.g., an OE module, with the waveguide layers is achieved in one step.

The present techniques may also be employed to align other optical components, such as optical connectors. Optical connectors may be used to couple an optical signal between two or more PCBs.

Figure 12:
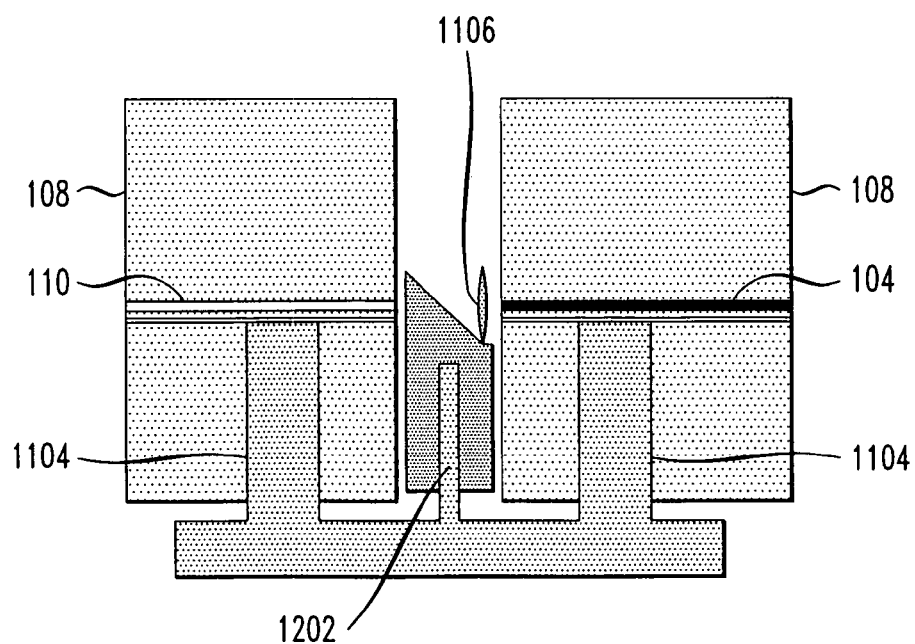
FIG. 12 is a diagram illustrating an optical element positioned through an intermediate alignment element according to an embodiment of the present invention.

In another exemplary embodiment, the optical elements, i.e., optical element 1106, is positioned in a receptacle that is fixed in an opening in the PCB. FIG. 12 depicts such a configuration. FIG. 12 is a diagram illustrating an optical element positioned through an intermediate alignment element. FIG. 12 has the same configuration as that shown and described in conjunction with the description of FIG. 11, except that the optical element 1106 is positioned in a receptacle, i.e., intermediate alignment element 1202.

Intermediate alignment element 1202 and optical element 1106 are typically manufactured using micro-machining or molding processes. Intermediate alignment element 1202, with optical element 1106 thereon, may be positioned and fixed into an opening in the PCB. This configuration may be advantageous in instances wherein optical element 1106 needs replacing due, e.g., to malfunctioning.

Accordingly, the receptacle can be irreversibly fixed into the board, whereas the optical element may be reversibly fixed to the receptacle, and as such, may be replaced. Further, the alignment features in the board may experience wear after several alignment instances. This particular exemplary configuration allows the receptacle to be made of more permanent, wear-resistant materials, such as a hard plastic or metal, because replacement of only the optical element is possible.

Thus, according to this exemplary embodiment, precise alignment of the optical components with the waveguide layers is achieved in two steps. First, intermediate alignment element 1202 is fixed in the PCB. Then, optical components are aligned with intermediate alignment element 1202.

Figure 13:
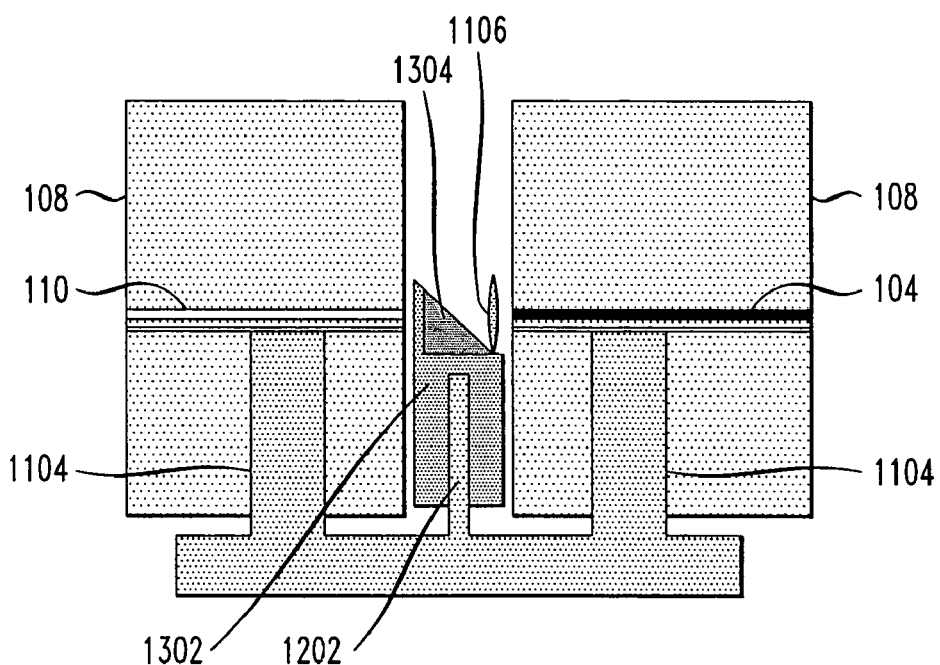
FIG. 13 is a diagram illustrating an optical element on a substrate positioned through an intermediate alignment element according to an embodiment of the present invention.

In the exemplary configurations shown in FIG. 11 and in FIG. 12, optical components, such as an OE module (not shown), would be aligned on top of the PCB, so as to direct light down into the PCB and through the optical element (a passive optical element) and into waveguide 110. In yet another exemplary embodiment, the OE module may be placed in the PCB. In such a configuration, optical element 1106 is combined with an OE module on a joined substrate. In this exemplary embodiment, optical element 1106 may be aligned on a substrate, the substrate being positioned in a receptacle that is fixed in an opening in the PCB. FIG. 13 depicts such a configuration. FIG. 13 is a diagram illustrating an optical element on a substrate positioned through an intermediate alignment element. FIG. 13 has the same configuration as that shown and described in conjunction with the description of FIG. 12, except that optical element 1106 and OE module 1304 are combined and aligned on substrate 1302.

According to this exemplary embodiment, precise alignment of the optical components with the waveguide layers is achieved in three steps. First, intermediate alignment element 1202 is fixed in the PCB. Next, optical element 1106 and OE module 1304 are combined and aligned on substrate 1302. Then, substrate 1302 is aligned to intermediate alignment element 1202. In all of the exemplary configurations shown in FIG. 11, FIG. 12 and FIG. 13, the alignment pins, e.g., alignment pins 1104, could be inserted either from the bottom (as shown) or from the top of the PCB.

The alignment pins and corresponding openings in the PCB may be circular and one opening may perform the x, y and z axes alignment of the optical components in the PCB. Several alternative alignment embodiments may be realized.

Figure 14:
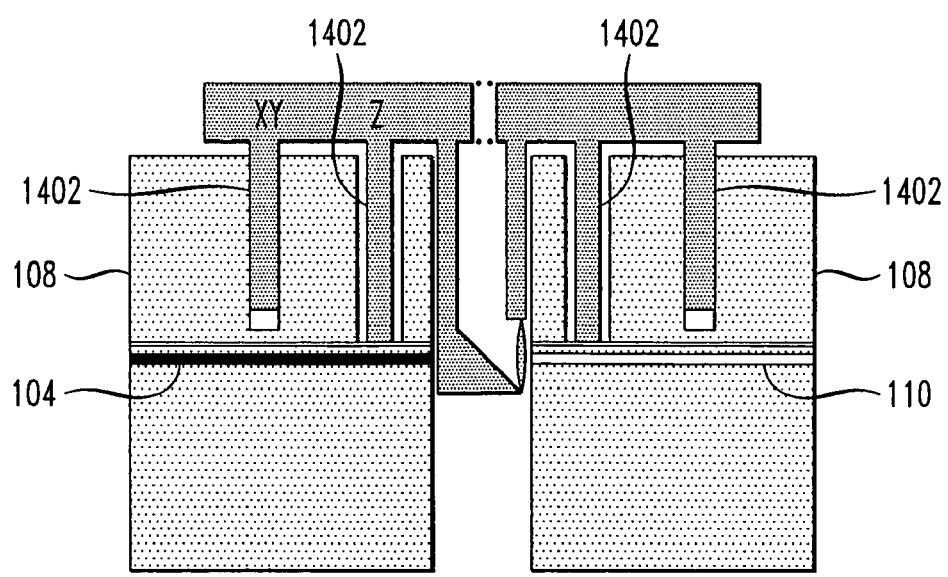
FIG. 14 is a diagram illustrating an optical component with multiple alignment pins according to an embodiment of the present invention.

In a first exemplary alternative embodiment, separate alignment pins and openings are used for each of the x, y and z axes alignments. For the x and y axes alignments, according to this particular exemplary embodiment, the position and diameter of each of the alignment pins and corresponding openings in the PCB must be manufactured with high precision. For the z axis alignment, the lengths of the alignment pins and the depths of the corresponding openings in the PCB must also be realized accurately. These different requirements may be achieved using different processing conditions and alignment pin geometries. FIG. 14 depicts such a configuration. FIG. 14 is a diagram illustrating an optical component with multiple alignment pins. Namely, FIG. 14 shows that multiple alignment pins 1402 may be used for the x, y and z axes alignments.

Having circular alignment pins and corresponding circular openings in the PCB is an effective approach to achieve exact alignment of the optical component with the waveguide layers. However, it is important to note that the alignment pins and corresponding openings in the PCB may have other non-circular shapes, including, but not limited to, a triangular shape, a rectangular shape, e.g., rectangular pins positioned in orthogonally oriented openings, and combinations comprising at least one of the foregoing shapes and may prove advantageous in cases wherein the alignment pin and corresponding opening diameter can not be realized with a high degree of accuracy, which may be the result of material properties or manufacturing tool specifications.

Figure 15:
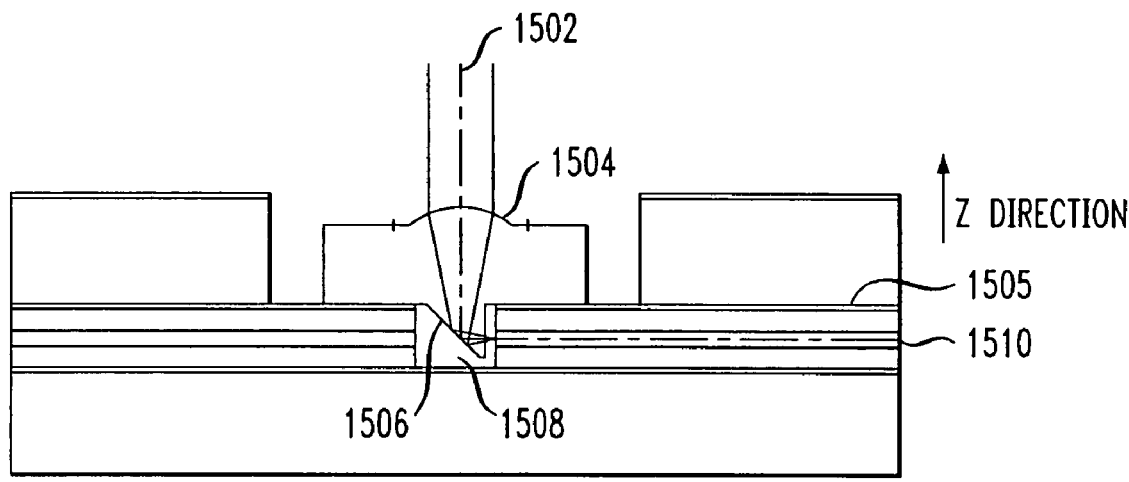
FIG. 15 is a diagram illustrating an exemplary combined microlens/turning mirror micro-optic embodiment according to an embodiment of the present invention.

FIG. 15 is a diagram illustrating an exemplary combined microlens/turning mirror micro-optic embodiment. Namely, in FIG. 15 the z axis alignment of optical component 1504 is controlled by z-stop metal layer 1505 on top of waveguide 1510. As such, collimated light beam 1502 may be directed through optical component 1504, reflected off of turning mirror 1506 (attached to the PCB using index-matching adhesive 1508) and into waveguide 1510.

Figure 16:
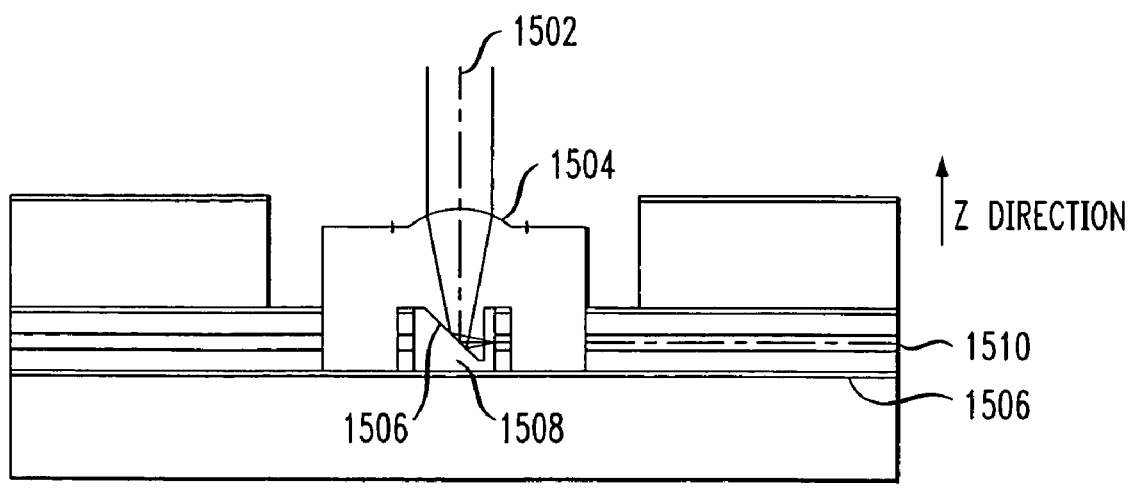
FIG. 16 is another diagram illustrating an exemplary combined microlens/turning mirror micro-optic embodiment according to an embodiment of the present invention.

FIG. 16 is a diagram illustrating an exemplary combined microlens/turning mirror micro-optic embodiment wherein a stop on the bottom of the waveguide is employed. FIG. 16 has the same configuration as that shown and described in conjunction with the description of FIG. 15, except that the z alignment of optical component 1504 is controlled by z-stop metal layer 1506 below waveguide 1510.

(V) Attaining Alignment Between Optical Components and an OE Module or Other Assembly As described in detail above, the waveguide cores can be accurately positioned relative to the fiducials in the one or more metal layers, e.g., top metal layer 712 of FIG. 7A, to within lithographic accuracies. This accurate positioning of the waveguide cores relative to the fiducials can be used to reference alignment pins, or any other suitable alignment means, to align an OE module with respect to the waveguide layers.

FIG. 17 is a diagram illustrating an exemplary method used to achieve precise lateral alignment between an optical element, a waveguide core and an OE module. Namely, FIG. 17 shows cross-sectional views and an isometric view of a PCB having optical component 1702 with integrated alignment pins. OE module 1706 with associated VCSEL/PD elements and drive electronics is fabricated with alignment holes that correspond to alignment pins 1704 which allow positioning of OE module 1706 above optical component 1702.

(VI) Extending Optical Components to Multi-layer Waveguide Configurations

Figure 18:
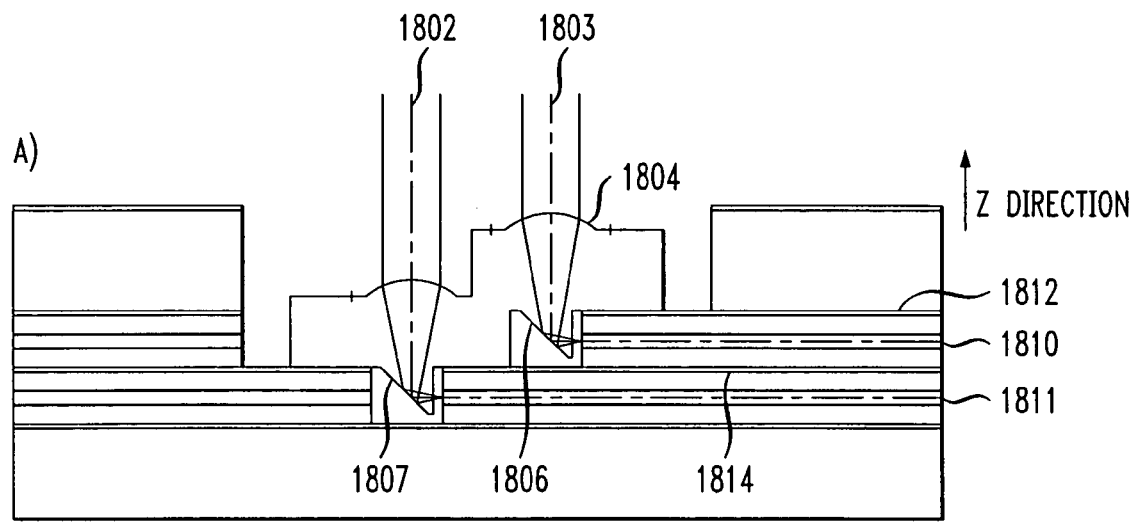
FIG. 18 is a diagram illustrating the accessing of multiple waveguide layers according to an embodiment of the present invention.

FIG. 18 is a diagram illustrating the accessing of multiple waveguide layers. Namely, FIG. 18 shows two separate collimated beams 1802 and 1803 being directed into single optical component 1804, the beams being deflected by separate turning mirrors 1806 and 1807 into separate waveguides 1810 and 1811, respectively. Multiple metal layers, e.g., z-stop metal layers 1812 and 1814, may be employed to provide z alignment for optical component 1804.

Figure 19:
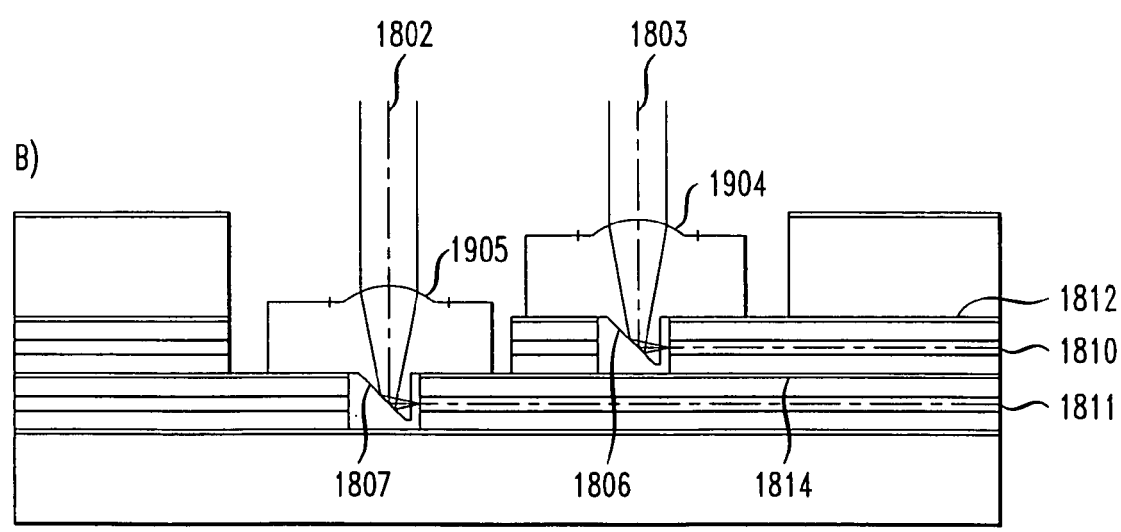
FIG. 19 is a diagram illustrating the accessing of multiple waveguide layers using separate optical components according to an embodiment of the present invention.

FIG. 19 is a diagram illustrating the accessing of multiple waveguide layers using separate optical components. FIG. 19 has the same configuration as that shown and described in conjunction with the description of FIG. 18, except that separate optical components 1904 and 1905 are employed.

(VII) Staggering Microlens/Focusing to Increase the Waveguide Density

Figure 20B:
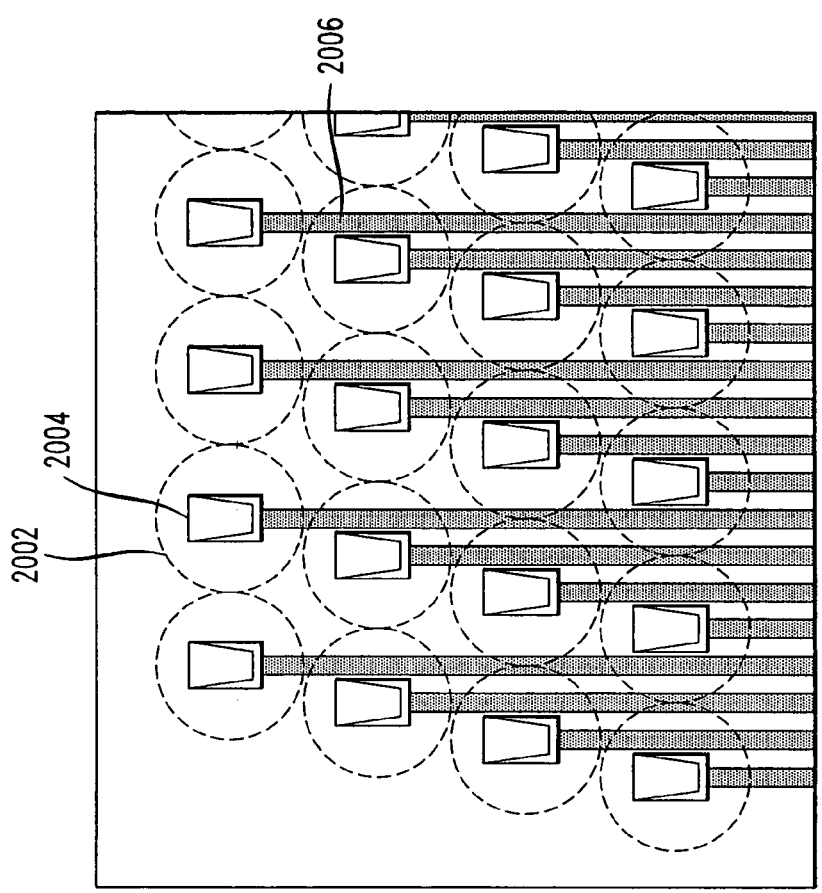
FIGS. 20A–B are diagrams illustrating staggering of turning mirrors and microlenses to increase waveguide density according to an embodiment of the present invention.
Figure 20A:
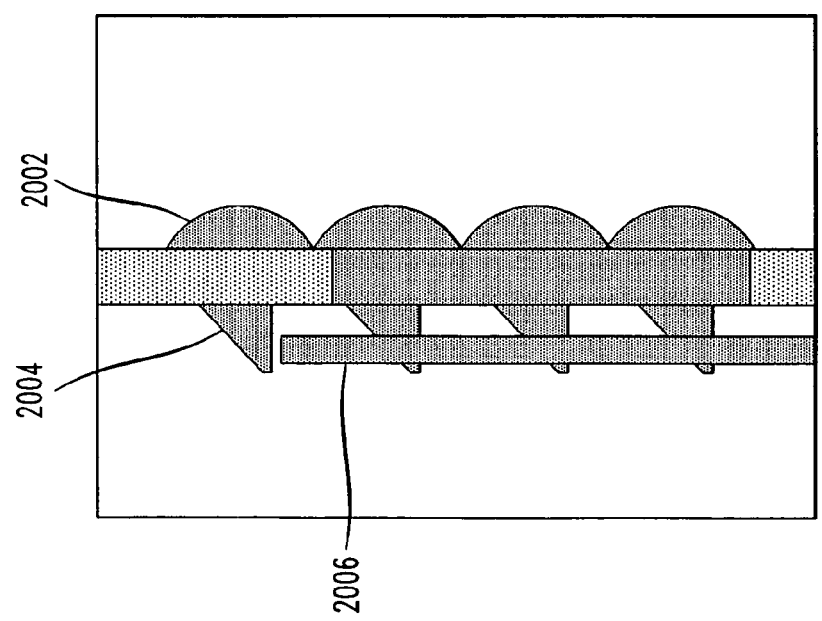

FIGS. 20A–B are diagrams illustrating staggering of turning mirrors and microlenses to increase waveguide density. Namely, FIG. 20A provides a cross-sectional view and FIG. 20B provides a top view of a PCB having staggered microlenses 2002 and turning mirrors 2004 along the direction of waveguides 2006. Staggering serves to decrease the spacing between waveguides 2006, thereby increasing waveguide density.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method of processing a circuit board having one or more optical waveguides associated therewith, the method comprising the steps of:
providing one or more etch stop layers in proximity to the one or more waveguides, at least one of the etch stop layers comprising one or more fiducials therein; and
from a surface of the circuit board, using the one or more etch stop layers to selectively remove material to provide one or more cavities having a defined positioning and depth in the circuit board, wherein said one or more cavities provide for an alignment of one or more optical elements.

2. The method of claim 1, wherein one or more of the fiducials define a positioning in a plane of the circuit board.

3. The method of claim 1, wherein one or more of the etch stop layers define a depth in the circuit board.

4. The method of claim 1, wherein at least one of the one or more cavities exposes at least a portion of the one or more waveguides.

5. The method of claim 1, wherein one or more of the etch stop layers acts as a selective etch stop.

6. The method of claim 1, wherein one or more of the etch stop layers acts as a complete etch stop.

7. The method of claim 1, wherein one or more of the etch stop layers comprises a metal.

8. The method of claim 7, wherein the metal is selected from the group consisting of copper, molybdenum, gold and combinations comprising at least one of the foregoing metals.

9. The method of claim 1, wherein one or more of the etch stop layers comprises a reflective dielectric thin film.

10. The method of claim 1, wherein the material removed comprises a substrate material.

11. The method of claim 10, wherein the substrate material is selected from the group consisting of glass, organic material, flexible organic material, polyimide and combinations comprising at least one of the foregoing substrate materials.

12. The method of claim 1, wherein the material is selectively removed using laser ablation techniques.

13. The method of claim 12, wherein the laser ablation techniques comprise use of a carbon dioxide laser.

14. The method of claim 1, wherein at least a portion of the material is selectively removed using reactive ion etching.

15. The method of claim 1, wherein one or more of the one or more cavities serve as one or more reference points to align at least one optical component with the one or more waveguides.

16. The method of claim 15, wherein the at least one optical component comprises one or more alignment pins each having a shape that corresponds with one or more of the one or more cavities.

17. The method of claim 16, wherein the alignment pins are circular.

18. The method of claim 15, wherein the at least one optical component is selected from the group consisting of opto-electronic modules, lenses, turning mirrors and combinations comprising at least one of the foregoing optical components.

19. The method of claim 1, wherein one or more of the one or more cavities serve as one or more reference points to align at least one receptacle for an optical component with the one or more waveguides.

20. The method of claim 1, wherein the circuit board has two or more waveguides associated therewith.

21. A circuit board having one or more optical waveguides associated therewith, wherein the circuit board comprise one or more cavities each with a positioning and depth defined using one or more etch stop layers located in proximity to the one or more waveguides, at least one of the etch stop layers comprising one or more fiducials therein, wherein said one or more cavities provide for an alignment of one or more optical elements.

22. The circuit board of claim 21, wherein one or more of the fiducials define a positioning in a plane of the circuit board.

23. The circuit board of claim 21, wherein one or more of the etch stop layers define a depth in the circuit board.

* * * * *